US008217666B2

(12) United States Patent
Hagimoto et al.

(10) Patent No.: US 8,217,666 B2
(45) Date of Patent: Jul. 10, 2012

(54) CAPACITANCE DETECTION APPARATUS

(75) Inventors: Masahiro Hagimoto, Anjo (JP); Hisashi Inaba, Kariya (JP); Kazunori Sugimura, Toyota (JP)

(73) Assignee: Aisin Seiki Kabushiki Kaisha, Kariya-Shi, Aichi (JP)

( * ) Notice: Subject to any disclaimer, the term of this patent is extended or adjusted under 35 U.S.C. 154(b) by 0 days.

(21) Appl. No.: 13/375,270

(22) PCT Filed: Jun. 28, 2010

(86) PCT No.: PCT/JP2010/060974
§ 371 (c)(1),
(2), (4) Date: Nov. 30, 2011

(87) PCT Pub. No.: WO2011/004727
PCT Pub. Date: Jan. 13, 2011

(65) Prior Publication Data
US 2012/0074963 A1  Mar. 29, 2012

(30) Foreign Application Priority Data
Jul. 9, 2009  (JP) .................................. 2009-163044

(51) Int. Cl.
*G01R 27/26* (2006.01)
(52) U.S. Cl. ........................ 324/678; 324/679; 324/658
(58) Field of Classification Search .. 324/762.01–762.1, 324/678, 658, 679, 76.16; 331/111; 323/222, 323/282; 257/48; 438/14–18; 363/17
See application file for complete search history.

(56) References Cited

U.S. PATENT DOCUMENTS
3,886,447 A * 5/1975 Tanaka ........................... 324/678
5,730,165 A  3/1998 Philipp
(Continued)

FOREIGN PATENT DOCUMENTS
JP  2005-106665 A  4/2005
(Continued)

OTHER PUBLICATIONS
International Search Report (PCT/ISA/210) issued on Aug. 3, 2010, by Japanese Patent Office as the International Searching Authority for International Application No. PCT/JP2010/060974.
(Continued)

*Primary Examiner* — Huy Q Phan
*Assistant Examiner* — Tung X Nguyen
(74) *Attorney, Agent, or Firm* — Buchanan Ingersoll & Rooney PC

(57) ABSTRACT

Provided is a capacitance detection apparatus capable of effectively discriminating between an external factor due to e.g. water drops and a human-induced operation and allowing detection of occurrence of the human-induced operation with a simple arrangement. The apparatus alternately executes a first switching control process and a second switching control process, the first and second switching control processes executing a second switch operation with different charging periods from each other. In each of the first and second switching control processes, the number of repetition times of the second switch operation is counted until the potential of a terminal of a reference capacitance changes to a set potential. Based on the number of repetition times in at least one of the two switching control processes, presence/absence of change in determined capacitance (i.e. capacitance to be determined) is determined and based on the numbers of repetition times in the two control processes, it is determined whether the change in the determined capacitance is due to an event of detection interest or not.

7 Claims, 7 Drawing Sheets

U.S. PATENT DOCUMENTS

| | | | |
|---|---|---|---|
| 6,377,056 B1 * | 4/2002 | Hanzawa et al. | 324/678 |
| 7,015,705 B2 | 3/2006 | Inaba et al. | |
| 7,804,307 B1 * | 9/2010 | Bokma et al. | 324/663 |
| 2005/0068045 A1 | 3/2005 | Inaba et al. | |
| 2007/0216175 A1 | 9/2007 | Tanimoto et al. | |
| 2009/0073140 A1 | 3/2009 | Fujita et al. | |

FOREIGN PATENT DOCUMENTS

| | | | |
|---|---|---|---|
| JP | 2006-211427 A | 8/2006 | |
| JP | 2008-108534 A | 5/2008 | |
| JP | 2008-275643 A | 11/2008 | |
| JP | 2009-71708 A | 4/2009 | |

OTHER PUBLICATIONS

Written Opinion (PCT/ISA/237) issued on Aug. 3, 2010, by Japanese Patent Office as the International Searching Authority for International Application No. PCT/JP2010/060974.

Notification of Transmittal of Copies of Translation of the International Preliminary Report on Patentability (Forms PCT/IB/338 and PCT/IB/373) and the Written Opinion of the International Searching Authority (Form PCT/ISA/237) issued on Feb. 23, 2012, in the corresponding International Application No. PCT/JP2010/060974. (6 pages).

* cited by examiner (a)

(b)

(a)

(b)

(a)

(b)

CAPACITANCE DETECTION APPARATUS

TECHNICAL FIELD

The present invention relates to a capacitance detection apparatus for detecting an unknown capacitance to be determined.

BACKGROUND ART

There is known a locking system ("smart entry system") configured to effect communication between a portable or mobile device carried by a user and a main apparatus mounted on a vehicle to verify the mobile device and control automatic locking/unlocking of a door. U.S. No. 2007/0216175A1, in its detailed disclosure (Patent Document 1), describes a technique relating to a door handle of a vehicle for executing locking/unlocking of a door based on detection of a user's operation on the door handle, after verification of a mobile device executed between a vehicle mounted apparatus and the mobile device. The door handle incorporates therein e.g. a capacitance detection apparatus for detecting approaching or touching of a user's hand to/with the door handle (Patent Document 1: see e.g. paragraphs [0025]-[0030]).

The capacitance detection apparatus is comprised of a switched capacitor technique which is described in e.g. the detailed disclosure of U.S. Pat. No. 7,015,705 B2 (Patent Document 2). According to this technique, a period for keeping a switch closed between a capacitance to be measured ("measured capacitance") and a reference capacitance is set to a certain multiple (several-fold) of a time constant which is represented by a product of an on-resistance of the switch and the capacitance to be measured. This arrangement serves to reduce deterioration in the sensitivity in the case of presence of a leak resistance in the measured capacitance, which occurs under a high-humidity environment, inadvertent adherence of water drops or the like to the surface of the capacitance detection apparatus, etc. (Patent Document 2: see e.g. column 5, L16 to column 7, L17, etc.).

The capacitance detection apparatus of Patent Document 2 is a distinguished apparatus capable of alleviating the effect of sensitivity deterioration in the presence of leak resistance in the measured capacitance. However, at the very moment of water adherence to the apparatus, the apparatus may be unable to effectively discriminate this adherence of water from a touching by a human. For instance, with the capacitance detection apparatus mounted to a door handle of a locking system disclosed in Patent Document 1, in the event of splashing of water onto the apparatus due to raindrops or car washing operation, locking/unlocking of the door may take place inadvertently, irrespective of the user's locking/unlocking intension.

PRIOR ART DOCUMENTS

Patent Documents

Patent Document 1: U.S. No. 2007/0216175A1, detailed disclosure thereof.

Patent Document 2: U.S. Pat. No. 7,015,705B2, detailed disclosure thereof.

SUMMARY OF THE INVENTION

Object to be Achieved by Invention

In view of the above-described problem, there is a need for a capacitance detection apparatus capable of effectively discriminating between an external factor due to e.g. water drops and a human-induced operation and allowing detection of occurrence of the human-induced operation with a simple arrangement.

Means for Achieving the Object

In view of the above-described object, according to a characterizing feature of a capacitance detection apparatus relating to the present invention, the capacitance detection apparatus comprises:

a first switch disposed between opposed terminals of a reference capacitance, one of the opposed terminals of the reference capacitance being connected to a first potential source;

a second switch disposed between the other terminal of a measured capacitance (i.e. a capacitance to be measured) and the other terminal of said reference capacitance, one terminal of terminal of said measured capacitance being connected to a second potential source or a free space;

a third switch disposed between the opposed terminals of said measured capacitance;

a first switch operation rendering said first switch to a closed state and then returning said first switch to an opened state upon lapse of an initialization period, a second switch operation rendering said second switch to a closed state and then returning said second switch to an opened state upon lapse of a first charging period, a third switch operation rendering said third switch to a closed state and then returning said third switch to an opened state upon lapse of a first discharging period;

a first switching control process executing said second switch operation and said third switch operation alternately after executing said first switch operation;

a second switching control process executing said first switch operation and then executing said second switch operation for a second charging period different from said first charging period and executing said third switch operation for a second discharging period, in alternation;

a switch controlling unit for alternately executing the first switching control process and the second switching control process;

a potential determining unit for determining whether the potential of the other terminal of said reference capacitance has changed to a predetermined set potential from an initial potential after said first switch operation, by said first switching control process and said second switching control process;

a counting unit for counting the number of times of repetition of said second switch operation executed until the potential of the other terminal of the reference capacitance changes to said set potential, in said first switching control process and said second switching control process; and an output determining unit for determining presence/absence of change in capacitance of said measured capacitance, based upon the counted number of repetition times counted in at least one of said first switching control process and said second switching control process, said output determining unit determining also whether the change in the capacitance in the measured capacitance is due to an event of detection interest or not, based on the numbers of repetition times in said first switching control process and the number of repetition times in said second switching control process.

The present inventors focused attention on the fact that the measured capacitance changes with different time constants between the case of e.g. a human's touching or contacting to a machine or device mounting the capacitance detection apparatus and the case of adherence of water drops or the like thereto. Then, based on this finding, the inventors set two kinds of closing periods for the second switch. With this, in accordance with two kinds of closing periods of the second switch, two kinds of switching control processes are executed and the number of repetition times of the second switch operation is counted in each control process. For instance, if the time constant is short, the number of the repetition times in the first switching control process and that in the second switching control process will be similar to each other, irrespective of the closing period of the second switch. On the other hand, in case the time constant is long, there is high possibility of the number of the repetition times in the first switching control process and that in the second switching control process being distinctly different in correspondence with the closing period of the second switch operation. Therefore, through comparison between the number of the repetition times in the first switching control process and that in the second switching control process, determination of what kind of event has occurred can be executed with accuracy. Further, based upon the numbers of repetition times, it is also possible to determine whether change has occurred in the measured capacitance or not. Therefore, according to the above-described arrangement of the present invention, it is possible to determine whether change has occurred in the measured capacitance or not and to determine also whether the event that caused the change is an event of detection interest or not. As a result, there has been realized a capacitance detection apparatus capable of effectively discriminating between an external factor due to e.g. water drops and a human-induced operation and allowing detection of occurrence of the human-induced operation with a simple arrangement.

Preferably, said first discharging period is set as a period longer than said first charging period and said second discharging period is set as a period longer than said second charging period.

If the first discharging period is set as a period longer than the first charging period and the second discharging period is set as a period longer than the second charging period, there will be no remaining capacitance in the measured capacitance, so that an accurate charging operation will be executed in each second switch operation. Consequently, there is obtained a capacitance detection apparatus with high accuracy.

Preferably, there is further provided a change amount calculating unit for calculating change amounts which are differences between the numbers of repetition times of the second switch operation executed respectively in two consecutively executed first control processes and in two consecutively executed second controls; and said output determining unit determines the presence/absence of change in capacitance of said measured capacitance, based upon said change amount in at least one of said two consecutively executed first switching control processes and said two consecutively executed second switching control processes, said output determining unit determining also whether the change in the capacitance in the measured capacitance is due to an event of detection interest or not, based on said change amounts in the first switching control process and the change amount in the second switching control process.

The change amount calculating unit calculates change amounts which are the differences between the numbers of the repetition times of the second switch operations executed in two consecutively executed first switching control processes and two consecutively executed second switching control processes, respectively. As described above, the output determining unit determines presence/absence of change in the capacitance of the measured capacitance, based upon at least one of the numbers of repetition times in the first switching control process and the second switching control process.

However, these numbers of repetition times are subject to such influences as the ambient temperature. On the other hand, the change amount above is a difference between the numbers of repetition times of the second switch operation executed under substantially same condition of ambient environment such as ambient temperature. Therefore, the influence from the ambient environment is substantially negligible. Hence, if the output determining unit determines presence/absence of change in the capacitance value of the measured capacitance based on at least one of the change amounts of the first switching control process and the second switching control process, determination with higher precision becomes possible. Similarly, the determination as to what event has occurred can be executed with high precision.

In the above, preferably, said output determining unit determines the presence/absence of change in the capacitance value of the measured capacitance based upon the change amount of the second switch operation which is executed with whichever shorter one of the first charging period or the second charging period.

The change in capacitance per unit period in the case of occurrence of an event of a long time constant is smaller than that in the case of occurrence of event of a short time constant. In other words, in the changes in the capacitance per first and second charging period, the change in the case of occurrence of event of long time constant is smaller than the change in the case of occurrence of event of short time constant. For this reason, in the case of occurrence of event of a long time constant, the change amount in the number of repetition times of the second switch operation is smaller. If the charging period which is the closing period of the second switch is short, the change in the capacitance will be even smaller in the case of an event of long time constant, so that the change amount in the number of repetition times of the second switch operation will be even smaller, as well. Accordingly, by determining presence/absence of change in the capacitance value of the measured capacitance based on the change amount in the one wherein the second switch operation is executed with the shorter charging period, an event having a long time constant, if occurred, can be treated as non-detection. For instance, in comparison between the case of human's touching or approaching to the apparatus mounting the capacitance detection apparatus and the case of water drops or the like adhering thereto, the time constant is longer in the latter case of adhering of water drops or the like to the apparatus. That is, if there has occurred an event of a long time constant, there is high likelihood of this event being adherence of water drops or the like to the apparatus. Therefore, by setting more strict determination criteria for the presence/absence of change in capacitance, in addition to the execution of the event determination, the detection precision of event can be improved.

Further, preferably, said output determining unit determines whether the change in the capacitance value of the measured capacitance is due to an event of detection interest or not, based on a ratio or a difference between the change amount in said first switching control process and the change amount in said second switching control process.

As described above, the output determining unit is capable of effectively determining what kind of event has occurred, by comparing the numbers of repetition times or change amounts in the first switching control process and the second switching control process. If the difference is employed as the method of this comparison, the determination can be made simple. Whereas, if the ratio is employed as the method of this comparison, the determination will have higher resistance against change in the ambient environment, so that determination with even higher precision will become possible.

MODE OF EMBODYING THE INVENTION

Figure 1:
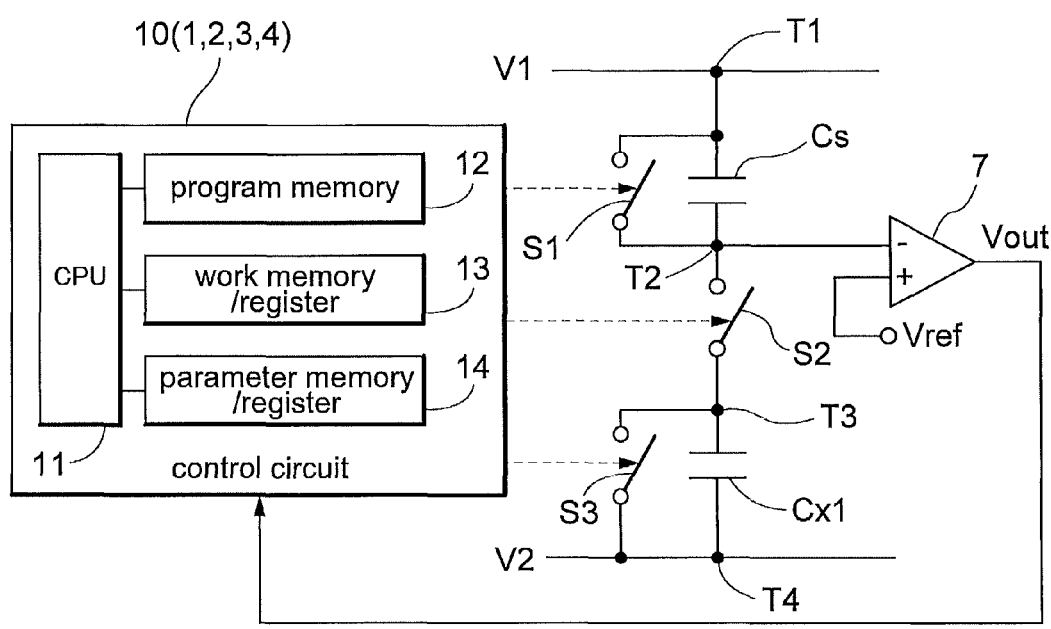
FIG. 1 is a circuit construction diagram schematically showing an example of a capacitance detection apparatus relating to the present invention.

Next, embodiments of the present invention will be described with reference to the accompanying drawings. As shown in FIG. 1, a capacitance detection apparatus relating to the present invention is configured to detect capacitance by a switched capacitance arrangement including a reference capacitance Cs, a capacitance to be measured ("measured capacitance") Cx1, and three switches S1, S2, S3. The first switch S1 is disposed between opposed terminals (between T1 and T2) of the reference capacitance Cs whose one terminal (T1) is connected to a first potential source (V1). The second switch S2 is disposed between the other terminal (T3) of the measured capacitance Cx1 whose one terminal (T4) is connected to a second potential source (V2) or a free space and the other terminal (T2) of the reference capacitance Cs. The third switch S3 is disposed between the opposed terminals (between T3 and T4) of the measured capacitance Cx1.

The other terminal (T2) of the reference capacitance Cs is connected to an inverting input terminal of a comparator 7 constituted of an operational amplifier. To the non-inverting input terminal of the comparator 7, there is connected a predetermined set potential Vref. The comparator 7 outputs a potential determination signal Vout in high level if the potential of the other terminal (T2) of the reference capacitance Cs changes from the initial potential to the predetermined set potential Vref. As will be described later herein, the initial potential is the first potential source V1. The comparator 7 corresponds to what is defined as "a potential determining unit" in the context of the present invention.

The three switches S1-S3 are controlled for their respective opening/closing operations by a control circuit 10. This control circuit 10 is constituted from e.g. a logic circuit such as a microcomputer, an ASIC (Application Specific Integrated Circuit), etc. In this embodiment, there are shown a CPU 11, a program memory 12, a work memory (work register) 13 and a parameter memory (parameter register) 14 as non-limiting specific examples. Other unillustrated peripheral circuits or the like too are included in this control circuit 10. Further, if desired, the CPU 11, the program memory 12, the work memory (work register) 13 and the parameter memory (parameter register) 14 can be integrated in a single microcomputer, as a matter of course.

In the control circuit 10, the hardware such as the CPU 11, and software stored in the program memory 12 and the parameter memory 14 cooperate to realize various functional units (sections). In the instant embodiment, the control circuit 10 includes various functional units or sections of a switch controlling unit 1, a counting unit 2, an output determining unit 3 and a change amount calculating unit 4.

Figure 2:
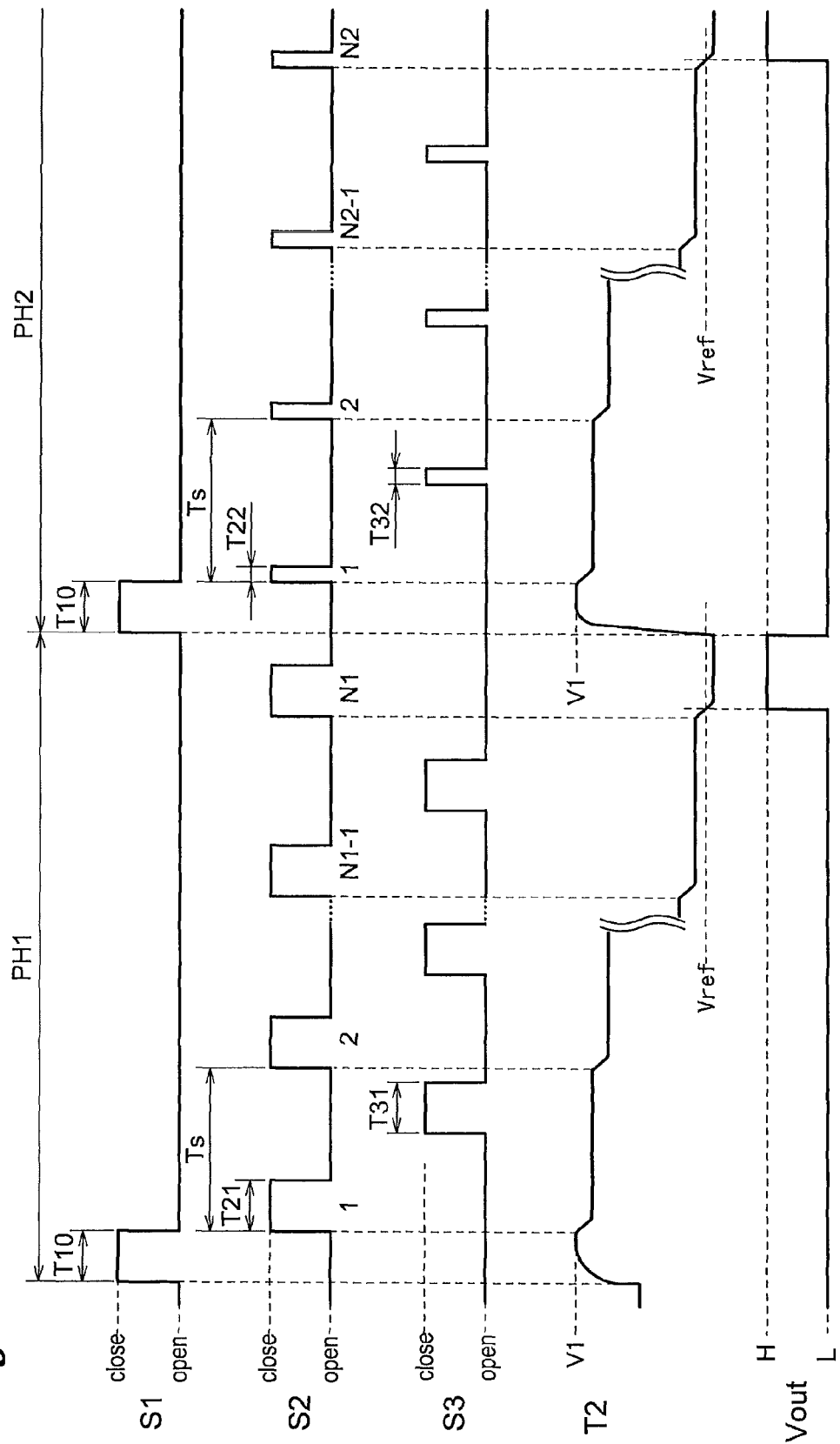
FIG. 2 is a timing chart schematically illustrating an example of operation of the capacitance detection apparatus.

The switch controlling unit 1 executes a first switching control process PH1 and a second switching control process PH2 both shown in FIG. 2 in alternation one after another. The first switching control process PH1 and the second switching control process PH2 are control processes of executing a second switch operation and a third switch operation in alternation and repetition after executing a first switch operation. As shown in FIG. 2, the first switch operation is an operation of rendering the first switch S1 to its closed state and then returning the first switch S1 to its opened state upon lapse of an initialization period T10. This first switch operation is executed similarly in the first switching control process PH1 and the second switching control process PH2. The second switch operation and the third switch operation, as will be detailed later, will be executed differently in the respect of closing period, between the first switching control process PH1 and the second switching control process PH2.

As shown in FIG. 2, in the first switching control process PH1, the second switch operation is executed as an operation of rendering the second switch S2 to its closed state and then returning it to its opened state upon lapse of a first charging period T21. In the first switching control process PH1, the third switch operation is executed as an operation of rendering the third switch S3 to its closed state and then returning it to its opened state upon lapse of a first discharging period T31. In the second switching control process PH2, the second switch operation is executed with a second charging period T22 which is different from the first charging period T21. In the second switching control process PH2, the third switch operation is an operation for rendering the third switch S3 to its closed state and then returning it to its opened sate upon lapse of a second discharging period T32. The first discharging period T31 and the second discharging period T32 can be either same or different as long as such period ensures sufficient discharging of the measured capacitance Cx1. Preferably, the first discharging period T31 is set as a period longer than the first charging period T21 and the second discharging period T32 is set as a period longer than the second charging period T22, because this arrangement allows reliable discharging of the measured capacitance Cx1. In the instant embodiment, the first charging period T21 is set as a period longer than the second charging period T22 and the first discharging period T31 is set as a period longer than the second discharging period T32. For making the control scheme more simple, the first charging period T21 and the first discharging period T31 can be set as a same period and the second charging period T22 and the second discharging period T32 can be set as a same period. In such case too, the first discharging period T31 will be set as a period longer than the first charging period T21 and the second discharging period T32 will be set as a period longer than the second charging period T22, so that the measured capacitance Cx1 may be discharged effectively.

As shown in FIG. 2, with the first switch operation of rendering the first switch S1 to the closed state and then returning it to the opened state upon lapse of the initialization period T10, the potential of the terminal T2 of the reference capacitance Cs becomes the potential of the potential source V1 which is the initial potential. After the execution of the first switch operation, the second switch operation and the third switch operation are executed in alternation and in repetition, whereby the potential of the terminal T2 will be lowered progressively. Eventually, when the potential of the terminal T2 has changed to the set potential Vref, the comparator 7 outputs a potential determination signal Vout, which signal is received by the control circuit 10, whereby the control circuit 10 can identify the period from the first switch operation to the reception of the potential determination signal Vout. Within the control circuit 10, the counting unit 2 is realized as a functional unit for counting the number of times of repetition of the second switch operations (N1, N2) which occur during which the potential of the terminal T2 of the reference capacitance Cs changes from the initial potential to the set potential Vref. Here, the number of repetition times N1 is the number of repetition times in the first switching control process PH1 and the number of repetition times N2 is the number of repetition times in the second switching control process PH2.

Figure 4:
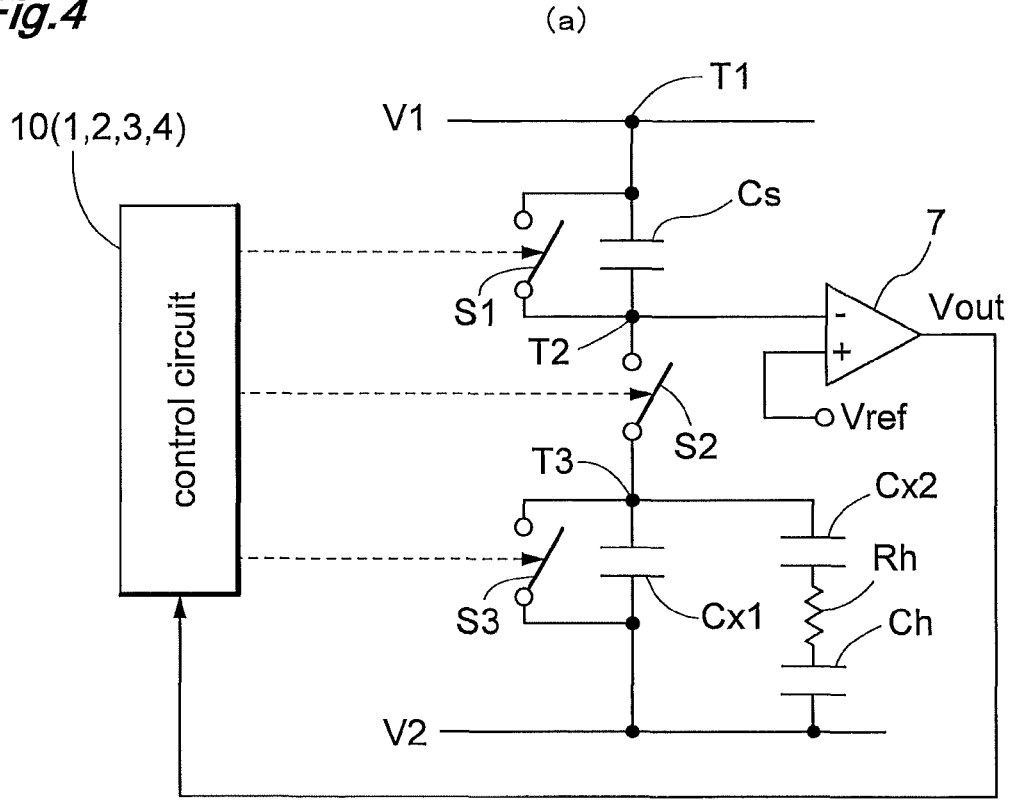
FIG. 4 is a view schematically showing an example of an equivalent circuit of the capacitance detection apparatus in the case of a human touch.
Figure 4:
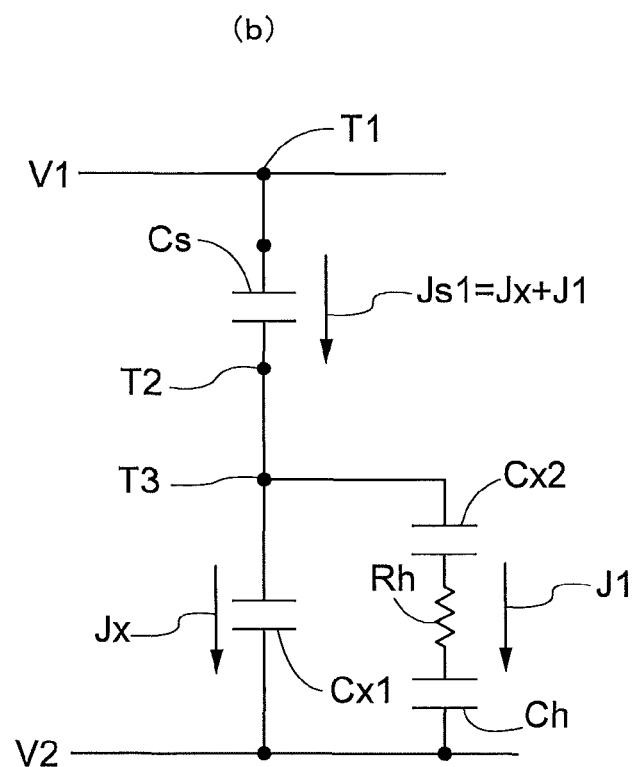

The circuit construction diagram of FIG. 1 shows the circuit in case a human or water drops or the like is/are not in contact with a detection unit of the capacitance detection apparatus. As will be detailed later with reference to the equivalent circuits shown in FIG. 4 and FIG. 5, in response to a human touch or contact or adherence of water drops or the like to the detection unit of the capacitance detection apparatus, the circuit will become a circuit including a coupling capacitance (Cx2) with the human, water drops or the like, a human capacitance (Ch), a human resistance (Rh), water drop resistance (Rw). As a result, there occurs a change in the number of repetition times (N1, N2), so that the touching of human or adherence of water drops or the like to the detection unit of the capacitance detection apparatus can be detected.

The output determining unit 3 is a functional unit for determining presence/absence of a change in the capacitance of the measured capacitance Cx1 based on at least one of the numbers of repetition times N1 and N2. More particularly, the output determining unit 3 is a functional unit for detecting human touching or adherence of water drops or the like to the detection unit of the capacitance detection apparatus. However, detection of presence/absence of change in the capacitance of the measured capacitance Cx1 alone does not allow clear distinction between the human touch and water drops adherence. For, as the capacitance is vulnerable to influence of ambient temperature, etc., the numbers of repetition times N1 and N2 also are subject to influence of ambient temperature. As shown in the equivalent circuits shown in FIG. 4 and FIG. 5, the equivalent circuits are different between the case of human touch and the case of adherence of water drops or the like and the circuit constants are different also therebetween. However, there remains the possibility of confusion therebetween.

Then, according to the present invention, the output determining unit 3 is provided with an additional function of determining whether a change in the capacitance value of the measured capacitance Cx1 is due to an event of detection interest or not, based on the number of repetition times N1 and the number of repetition times N2. More particularly, the output determining unit 3 determines whether change in the capacitance of the measured capacitance Cx1 is due to a human touch or not, based on the number of repetition times N1 and the number of repetition times N2. As will be detailed later, the number of repetition times N1 and the number of repetition times N2 with the different conditions relating to the closing period of the second switch S2 (i.e. the first charging period T21 and the second charging period T22), these periods will have a substantially same value in the case of human touch, whereas the periods will have a distinct difference therebetween in the case of adherence of water drops or the like. Therefore, by comparing the number of repetition times N1 and the number of repetition times N2 with each other, it is possible to determine whether a change in the capacitance of the measured capacitance Cx1 is due to an event of detection interest or not.

The change amount calculating unit 4 is a functional unit for calculating differences between the numbers of repetition times (N1, N2) of the repeatedly executed second switch operations in two successively executed first switching control process PH1 and second switching control process PH2 as change amounts (ΔN1, ΔN2). As described above, the output determining unit 3 determines presence/absence of change in the capacitance of the measured capacitance Cx1, based on at least one of the number of repetition times N1 and N2. However, these numbers of repetition times N1 and N2 can be affected by ambient environment such as the ambient temperature. On the other hand, the change amount ΔN1 or ΔN2 is a difference between the numbers of repetition times with conditions of ambient environment such as the ambient temperature being substantially same. That is, the ambient environment such as ambient temperature hardly changes during such a short period as the interval between the current first and second switching control processes and the previous first and second switching control processes. Therefore, the change amount ΔN1, ΔN2 can be considered as a difference between the numbers of repetition times under substantially same conditions. Accordingly, with utilizing the change amount ΔN1, ΔN2, the influence from the ambient environment in the determination by the output determining unit 3. becomes substantially negligible. Hence, high precision determination is made possible by determining presence/absence of change in the capacitance of the measured capacitance Cx1, based on at least one of the change amounts ΔN1, ΔN2.

Similarly, in case the determination of whether an event is of detection interest or not is made through comparison between the number of repetition times N1 and the number of repetition times N2, the determination precision will deteriorate if affected by influence from the ambient environment such as the ambient temperature. The output determining unit 3 is capable of determining whether a change in the capacitance of the measured capacitance Cx1 is due to an event of detection interest or not by comparing the change amounts ΔN1, ΔN2 with each other. In this case, like the determination of the presence/absence of any change in the capacitance of the measured capacitance Cx1, the influence from the ambient environment can be substantially neglected. For example, the output determining unit 3 determines whether the change is due to an event of detection interest or not, based on a difference or a ratio between the change amount ΔN1 in the first switching control process PH1 and the change amount ΔN2 in the second switching control process PH2.

As shown in FIG. 2, the second switch S2, in this embodiment is closed for the first charging period T21 in the case of the first switching control process PH1. In the case of the second switching control process PH2, the second switch S2 is closed for the second charging period T22. FIG. 2 shows an exemplary arrangement in which as for the closing period of the third switch S3 like the closing period of the second switch S2, the first discharging period T31 in the first switching control process PH1 is longer than the second discharging period T32 in the second switching control process PH2. In this, it is possible to set e.g. the first charging period T21 and the first discharging period T31 as a same period and to set the second charging period T22 and the second discharging period T32 as a same period. Incidentally, as described above, in the first switching control process PH1 and the second switching control process PH2, the first discharging period T31 and the second discharging period T32 can be a same period. As to the first discharging period T31 and the second discharging period T32, it will suffice for these periods to be set as periods sufficient to allow discharging of the measured capacitance Cx1, and these periods need not necessarily be set in accordance with the first charging period T21 and the first discharging period T31.

As shown in FIG. 2, the second switch S2 and the third switch S3 are controlled to be closed in alternation. As described above, the closing periods of the second switch S2 differ between the first switching control process PH1 and the second switching control process S3, whereas the control cycle Ts is same therebetween. That is, the second switch S2 and the third switch S3 are controlled at a predetermined frequency and with different pulse widths. Therefore, even though there are provided two phases of the first switching control process PH1 and the second switching control process PH2, it is still possible to restrict disadvantageous increase in the number of components such as provision of a plurality of oscillators or enlargement of the circuit. The details of this arrangement will be described later with reference to FIG. 7.

Figure 3:
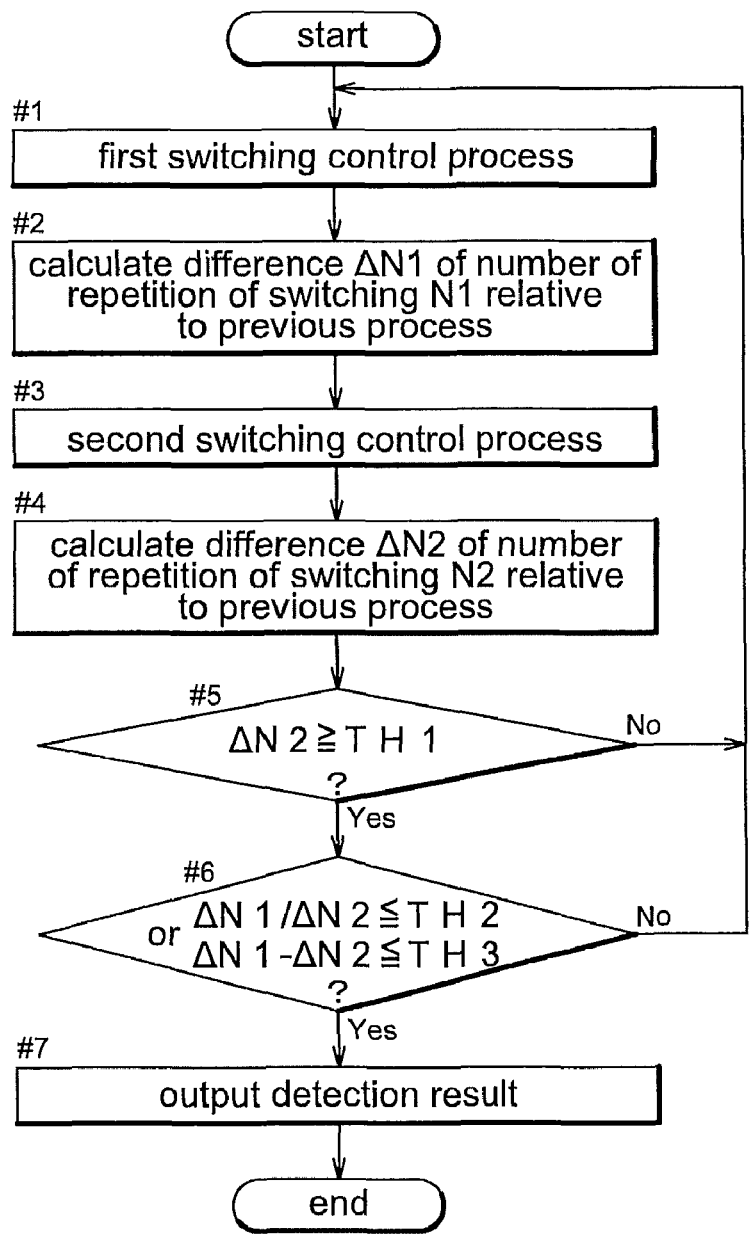
FIG. 3 is a flowchart schematically illustrating an exemplary procedure of the operations of the capacitance detection apparatus.

Next, with reference to FIG. 3, the operational procedure of the inventive capacitance detection apparatus will be explained. Firstly, the above-described first switching control process PH1 is executed and the number of repetition times of the second switch operations is counted (step #1). In this embodiment, this step #1 is executed through cooperation of the CPU 11, the program memory 12, the work memory (work register) 13, the parameter memory (parameter resister) 14. At step #1, there are employed the initialization period T10, the first charging period T21, the first discharging period T31 etc. stored in the parameter memory 14.

After calculation of the number of repetition times N1, a difference ΔN1 between the number of repetition times N1 counted at step #1 and the latest number of repetition times N1 is calculated (step #2). This calculated change amount ΔN1 is temporarily stored in the work memory (work register) 13 as a temporary storage means. And, the number of repetition times N1 also is temporarily stored in the work memory 13.

Next, the above-described second switching control process PH2 is executed and the number of repetition times N2 of the second switch operations is counted (step #3). At step #3, there are employed the initialization period T10, the second charging period T22, the second discharging period T32 etc. stored in the parameter memory 14. Then, like the first switching control process H1 above, a difference ΔN2 between the number of repetition times N2 counted at step #3 and the latest number of repetition times N2 is calculated (step #4). This calculated change amount ΔN2 is temporarily stored e.g. in the work memory 13 as a temporary storage means. And, the number of repetition times N2 also is temporarily stored in the work memory 13.

After completion of the above-described respective steps, a process of output determination is executed. Firstly, based upon the number of the repetition times counted in at least one of the first switching control process PH1 and the second switching control process PH2, the process determines presence/absence of any change in the capacitance in the measured capacitance Cx1. In the instant embodiment, this determination is made based on the change amount ΔN2 in the number of repetition times counted in the second switching control process PH2 (step #5). Though details will be given later herein, the reason for the above is that because the change amount ΔN2 in the number of repetition times N2 of the second switch S2 is smaller in its degree than ΔN1, the possibility of erroneous determination is less. In the instant embodiment, it is determined that the capacitance of the measured capacitance Cx1 has changed if the change amount ΔN2 is greater than a threshold value TH1.

If the result of determination at step #5 is NO, then, the process returns to step #1 to effect the steps #1 to #5 again. On the other hand, if the result of determination at step #5 is YES, that is, if the first determination condition is satisfied, the process checks the second determination condition. Namely, based upon the number of repetition times N1 in the first switching control process and the number of repetition times N2 in the second switching control process PH2, it is determined whether the change in the capacitance of the measured capacitance Cx1 is due to the event of detection interest or not (step #6). This determination can employ two conditions. The flowchart of FIG. 3 shows these conditions as logical addition. However, since the determination requires satisfaction of either one of them, the determination can be made with only one of them as the required condition, rather than executing such logical addition.

One of the parallel conditions relates to a ratio between the change amount ΔN1 and the change amount ΔN2. At step #6, there is shown an example of such condition which is satisfied if (ΔN1/ΔN2) is equal to or less than the threshold value TH2. As will be described later, these change amount ΔN1 and the change amount ΔN2 will not have widely different values. Therefore, the ratio therebetween will be substantially 1/1. On the other hand, in the case of adherence of water drops or the like, the change amount ΔN2 in the second switching control process PH2 in which the closing period of the second switch S2 (i.e. the second charging period T22) is shorter is smaller than the change amount ΔN1 (to be detailed later). Accordingly, the ratio between the change amount ΔN1 and the change amount ΔN2 will significantly deviate from 1/1. In the case of this embodiment, the change amount ΔN2 becomes smaller, so that the ratio (ΔN1/ΔN2) becomes greater. Therefore, by setting of the condition which is satisfied when (ΔN1/ΔN2) is less than a threshold TH2, it is possible to determine that this condition is not satisfied in the case of adherence of water drops or the like.

The other one of the parallel conditions relates to the difference between the change amount ΔN1 and the change amount ΔN2. As described hereinbefore, in the case of a human touch, the change amount ΔN1 and the change amount ΔN2 will not have widely different values, and the difference therebetween will become substantially zero. On the other hand, in the case of adherence of water drops, the change amount ΔN2 becomes smaller relative to the change amount ΔN1, so that the difference therebetween becomes greater. Therefore, by setting of the condition which is satisfied when (ΔN1−ΔN2) is less than a threshold TH3, it is possible to determine that this condition is not satisfied in the case of adherence of water drops or the like.

When the condition at step #5 is satisfied and either one of the conditions at step #6 is satisfied, the process outputs a detection result (step #7). For example, the process will output a detection result to the effect that a human touch took place.

Next, there will be explained the case of human touch and the case of adherence of water drops. In the case of a human approaching/touching the measured capacitance Cx1, as shown by the equivalent circuit in FIG. 4, in parallel with the measured capacitance Cx1, the coupling capacitance between the measured capacitance Cx1 and the human, a human resistance Rh, a human capacitance Ch will be added. Upon closing of the second switch S2, a charging current Jx will flow for charging the reference capacitance Cs and the measured capacitance Cx1. Simultaneously, there will also flow a current J1 for charging the coupling capacitance Cx2 generated as result of human approaching/touching, and the human capacitance Ch. Namely, as a result of human approaching/touching the measured capacitance Cx1, the measured capacitance Cx1 increases by a capacitance of ΔC by the time constant τ represented by the following formula.

$$\tau = Rh \times (Cx2 \times Ch)/(Cx2+Ch)$$

$$\Delta C = (Cx2 \times Ch)/(Cx2+Ch)$$

With the above, the number of repetition times N1 and N2 until the potential of the terminal T2 of the reference capacitance Cs reaches the predetermined potential decrease. If the amount of this decrease is large, the above-described ΔN1, ΔN2 become greater than the threshold value TH1.

Figure 5:
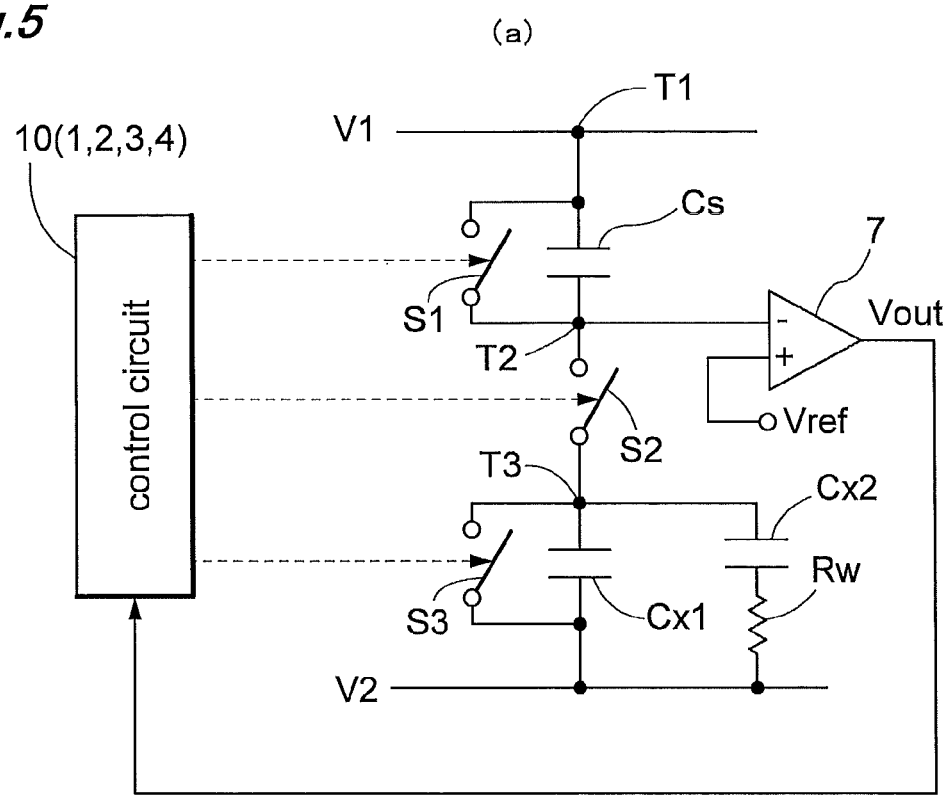
FIG. 5 is a view schematically showing an example of an equivalent circuit of the capacitance detection apparatus in the case of adherence of water drops.
Figure 5:
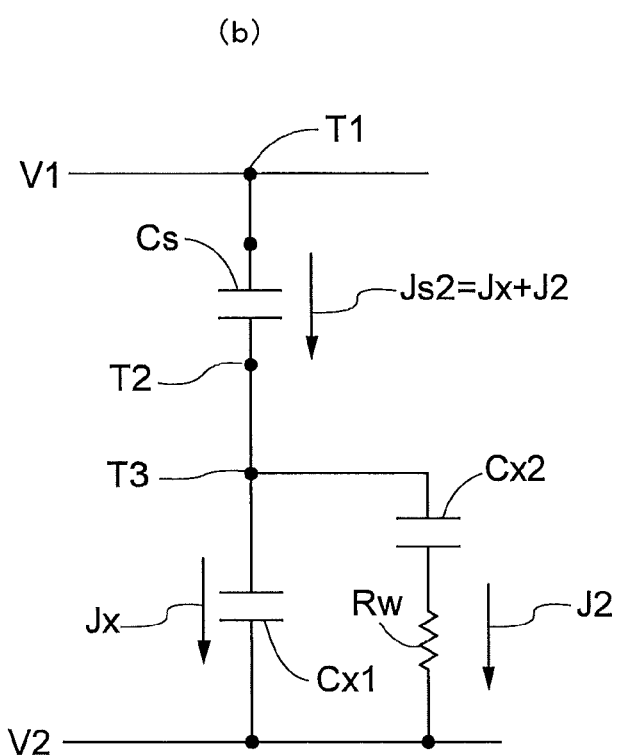

In the case of adherence of water drops or the like to the measured capacitance Cx1, as shown in the equivalent circuit of FIG. 5, in parallel with the measured capacitance Cx1, a coupling capacitance between the measured capacitance Cx1 and the water drops or the like and a water resistance Rw are added. The coupling capacitance Cx2 is formed between the electrode of the measured capacitance and the water drops. For instance, in case the detection electrode is attached to the inside of the door handle, an amount of resin exists between the electrode the measured capacitance and the exterior of the door handle. The water drops will attach to the exterior surface of the door handle and a human touches it through this exterior, the coupling capacitance Cx2 will be substantially same constant, in the case of a human and the case of water drops. On the other hand, the resistance will widely differ between a human and water drops. Further, in the case of water drops, short circuit occurs to e.g. the body of an automobile, so that there will occur no capacitance corresponding to the human capacitance Ch.

Upon closing of the second switch S2, the charging current Jx will flow for charging the reference capacitance Cs and the measured capacitance Cx1. Simultaneously, there will also flow a current J2 for charging the coupling capacitance Cx2 generated as result of adherence of water drops. Namely, as a result of approaching/contact of water drops to the measured capacitance Cx1, the measured capacitance Cx1 increases by a capacitance of ΔC by the time constant represented by the following formula.

$$\tau = Rh \times Cx2$$

$$\Delta C = Cx2$$

With the above, the number of repetition times N1 and N2 until the potential of the terminal T2 of the reference capacitance Cs reaches the predetermined potential decrease. If the amount of this decrease is large, the above-described ΔN1, ΔN2 become greater than the threshold value TH1.

As described above, with using the change amounts ΔN1 and ΔN2 in either one of the first switching control process PH1 and the second switching control process PH2, it is possible to detect a change in the measured capacitance Cx1. Therefore, the presence/absence of a change in the measured capacitance Cx1 may be determined, with using only one of them or using both of them. However, as will be detailed later, the change amount ΔN2 in the second switching control process PH2 in which the second switch S2 is closed for the second charging period T22 shorter than the first charging period T21 can sometimes be smaller in its amount than ΔN1. Therefore, in order to increase resistance against erroneous determination and shorten the calculation period and simplify the construction of the capacitance detection apparatus such as the construction of the programs, only the change amount ΔN2 alone is employed for the determination in this embodiment (step #5).

Next, there will be explained the principle that allows discrimination between a human operation (touching of a finger, etc.) and adherence of water drops or the like, by the above-described arrangements and processes in the capacitance detection apparatus mounted in a door handle of a vehicle door. Supposing the size of the electrode in case the measured capacitance Cx1 is incorporated within the door handle of the vehicle door is about 100 mm$^2$, the coupling capacitance Cx2 is about a few pF (e.g. 1 pF). According to the well-known human electrostatic model, the human resistance Rh is a few kΩ (e.g. 2 kΩ). and the capacitance Ch is a few hundreds pF (e.g. 200 pF).

In case a human approaches the measured capacitance Cx1, the capacitance thereof will increase by a capacitance of ΔC=1 pF by the time constant τ=2 ns represented by the following formula.

$$\tau = Rh \times (Cx2 \times Ch)/(Cx2+Ch) = 2k \times 1p \times 200p/(1p+200p)$$
$$\approx 2n[s]$$

$$\Delta C = (Cx2 \times Ch)/(Cx2+Ch) = 1p \times 200p/(1p+200p) \approx 1p[F]$$

On the other hand, in the case of adherence of water drops or the like, though will be affected by the amount and/or quality of the water, its resistance Rw will be about several hundreds of kΩ, which is supposed to be 300 kΩ in this particular case. The coupling capacitance Cx2 will be substantially same constant, in the case of human and the case of water drops. On the other hand, the resistance will widely differ between a human and water drops. Further, in the case of adherence of water drops, the capacitance will increase by ΔC=1 p with the time constant τ=300 ns represented by the following formula.

$$\tau = Rw \times Cx2 = 300k \times 1p = 300n[s]$$

$$\Delta C = Cx2 = 1p[F]$$

Figure 6:
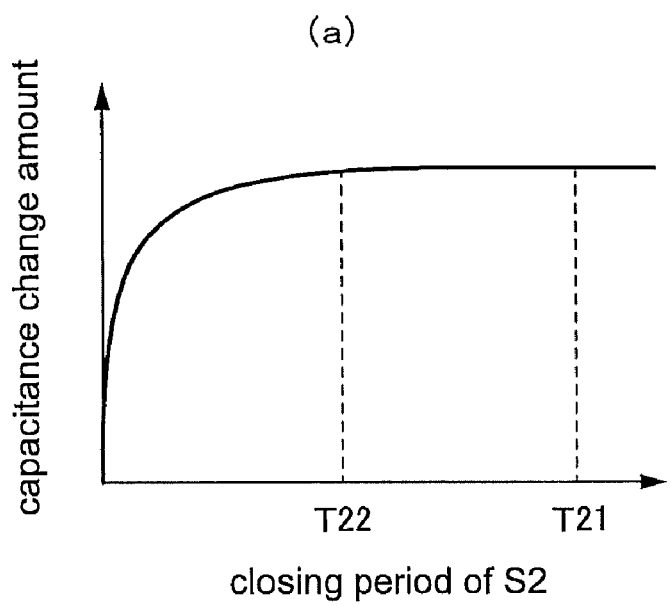
FIG. 6 is a view for explaining difference in capacitance variation between the case of a human touch and the case of adherence of water drops.
Figure 6:
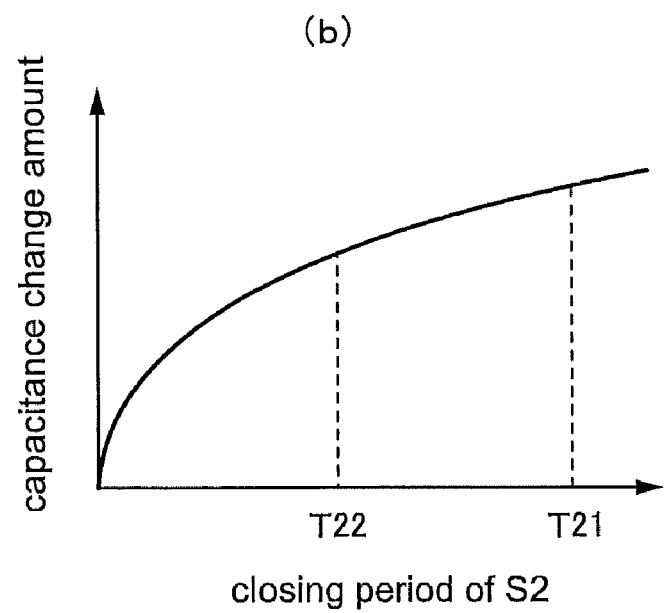

In this way, in both the case of a human and the case of water drops, the capacitance increases with the respective time constant. However, the time constant τ in the case of a human is smaller than the time constant τ in the case of water drops, the capacitance increases more quickly than the case of adherence of water drops. FIG. 6(a) is a graph schematically showing capacitance increase in the case of human. FIG. 6(b) is a graph schematically showing capacitance increase in the case of water drops. As may be seen, in the case of the human touching/approaching with the smaller time constant ζ, the change of capacitance occurs quickly; whereas, in the case of adherence of water drops with greater time constant τ, the change of capacitance occurs slowly.

Here, of the first and second charging periods as the closing period of the second switch S2, the first charging period T21, which is the longer one, will be set as a period that allows sufficient capacitance change both in the case of human and in the case of water drops. For instance, preferably, this is set to about 300 ns which is the time constant τ in the case of water drops. On the other hand, of the first and second charging periods as the closing period of the second switch S2, the second charging period T22, which is the shorter one, will be set as a period that allows sufficient capacitance change in the case of human touch (approaching) as the event of detection interest and that is insufficient for capacitance change in the case of water drops adherence. That is, the second charging period T22 is set as a period which is shorter than the first charging period T21 and which is in the course of capacitance change in the case of water drops as shown in FIG. 6(b). For instance, in the case of the particular numeral values employed in this embodiment, the second charging period T22 will be set, preferably, as a period of, e.g. 150 ns, that exceeds 2 ns which the time constant 2 ns which is the time constant t in the case of human and that at the same time is sufficiently shorter than 300 ns which is the time constant t in the case of water drops. Needless to say, the period may be set to an even shorter period, e.g. a few tens of ns, including the environmental errors. Incidentally, as for the closing period of the third switch S3, this period can be set any period sufficient for discharging of the measured capacitance Cx1. Therefore, this period can be set, without necessarily depending on the first charging period T21 and the second charging period T22 which are the closing periods of the second switch S2.

In the case of a human touch, whether the switching of the second switch S2 is executed with the first charging period T21 or with the second charging period T22, the change amounts in the capacitance will be substantially same. Therefore, the numbers of switching actions counted by the counting unit 2 will be substantially same in the first switching control process PH1 and the second switching control process PH2. Namely, the difference between the count number N1 and the count number N2 will be small and the ratio therebetween too becomes nearly 1 (one). Similarly, the difference between the change amount ΔN1 and the change amount ΔN2 will be small and the ratio therebetween will be nearly 1 (one).

On the other hand, in the case of adherence of water drops, the change amounts or rates of the capacitance will differ between the case of the second switch S2 being switched with the first charging period T21 and the case of the same switch S2 being switched with the second charging period T22. Specifically, the number of switching N2 in the case of the second charging period T22 with smaller increase in capacitance will be greater than N1. Therefore, the number of switching (repetition times thereof) counted by the counting unit 2 will widely differ between the first switching control process PH1 and the second switching control process PH2. That is, the difference between the count number N1 and the count number N2 will be great and the ratio therebetween too will deviate from 1 (one). Similarly, the difference between the change amount ΔN1 and the change amount ΔN2 will be great and the ratio therebetween too will deviate from 1 (one).

As described above, depending on whether the difference between the switching number N1 and the switching number N2 in the first switching control process PH1 and the second switching control process PH2 is greater than the threshold value or not, it is possible to discriminate between a human touch (approaching) and adherence of water drops or the like. For instance, if the difference is smaller than the threshold value, it may be determined that the event is not adherence of water drops but a human touch. Needless to say, similar discrimination is possible, based not on the switching number of times N1 and N2, but on the change amounts ΔN1 and ΔN2. Use of such change amounts achieves enhancement of resistance against environmental changes (see step #6).

Similarly, depending on whether the ratio between the number of switching times N1 and N2 is near 1 (one) or not, e.g. whether the value of (N1/N2) is greater than a threshold value or not, discrimination between a human touch and adherence of water drops or the like is possible. That is, in the case of adherence of water drops or the like, the number of switching N2 becomes greater than N1, the denominator of (N1/N2) becomes greater, thus the value of the ratio becomes smaller. Therefore, if the value is greater than a predetermined threshold value, it may be determined that the event at issue is a human touch. Needless to say, similar determination is possible, based not o the switching numbers N1 and N2, but on the change amounts ΔN1 and ΔN2. Use of such change amounts achieve enhancement of resistance against environmental changes. In the case of the change amounts ΔN1 and ΔN2, the change amount ΔN1 in the case of the first switching control process PH1 having the fewer number of switching repetitions becomes greater than ΔN2. Therefore, depending on whether the value of (ΔN1/ΔN2) is smaller than a predetermined threshold value (e.g. TH2), it is possible to determine whether the event at issue is a human touch (approaching) or adherence of water drops or the like (see step #6).

The change amount ΔN2 has a smaller value in the case of adherence of water drops or the like than the case of a human touch. Therefore, by executing the determination at step #3 with using not the change amount ΔN1, but the change amount ΔN2, precision of determination is improved. That is, in the case of adherence of water drops or the like, there is high likelihood of the change amount ΔN2 becoming short of the predetermined threshold value TH1. Hence, erroneous determination of the event being a human touch will not be made, absent the determination at step #6. Therefore, the resistance for a human touch which is the event of detection interest will be enhanced.

Figure 7:
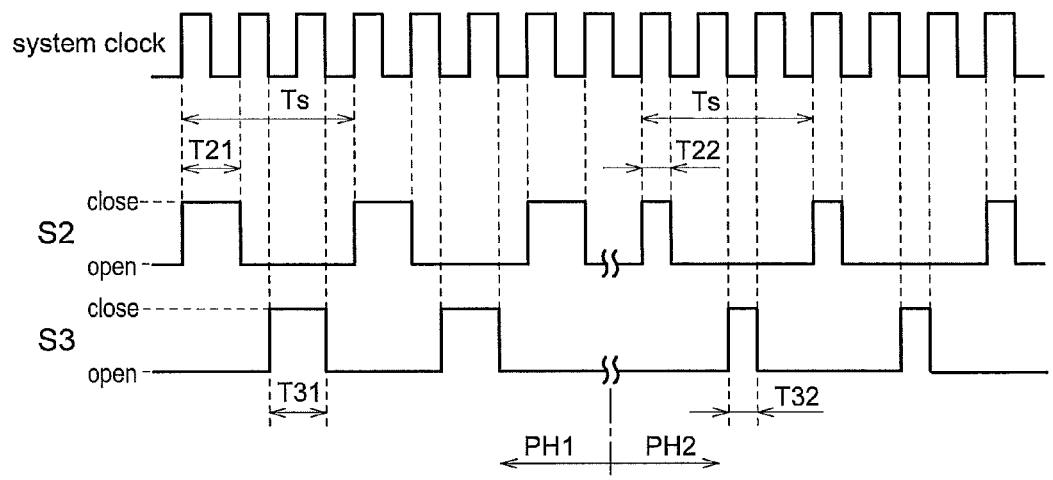
FIG. 7 is a timing chart illustrating an example of a method of controlling switching timings.
Figure 7:
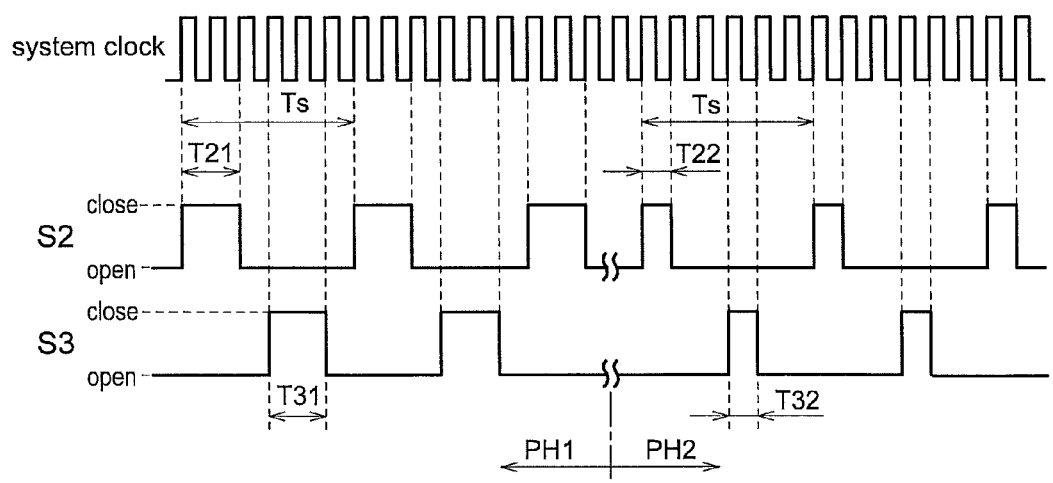

In the instant embodiment, as shown in FIG. 2, switching cycles Ts of the second switch S2 and the third switch S3 are same in the first switching control process PH1 and the second switching control process PH2. That is, the switching frequencies are same. An example of technique for generating such switching timing will be supplementarily described with reference to FIG. 7. For example, with using a system clock of a logic circuit such as the microcomputer or ASIC constituting the control circuit 10, the second switch S2 and the third switch S3 can be controlled as shown in FIG. 7(a). The switching cycles Ts each corresponds to three cycles of the system clock in the first switching control process PH1 and the second switching control process PH2 and comprise a same period. Incidentally, in FIG. 7(a), the second switch S2 and the third switch S3 are controlled with using both the rising edge and falling edge of the system clock. However, the invention is not limited thereto. For instance, as illustrated in FIG. 7(b), the switches can be controlled with using only one of the edges (e.g. the rising edge).

Further, for such modes of control, it is also possible to render the switching periods different from each other. For instance, the first switching control process and the second switching control process can be constituted from a completely same logic circuit or program whereas the clock for driving the logic circuit or the clock of the CPU for executing program can be made different from each other. In this case, the closing periods (corresponding to the first charging period T21 and the second charging period T22) of the second switch S2 whose switching periods are rendered different by the change of the clock frequency are rendered different from each other also. However, in this case, it is necessary to provide a plurality of clocks and to switch over the clocks with using a separate circuit or program, thus resulting in enlargement of the capacitance detection apparatus, which may lead to disadvantageous cost increase. Therefore, as described above in the foregoing embodiment, the preferred arrangement is an arrangement that the closing periods are made different with the switching cycle Ts being same.

As described above, according to the present invention, it has become possible to provide a capacitance detection apparatus capable of effectively discriminating between an external factor due to e.g. water drops and a human-induced operation and allowing detection of occurrence of the human-induced operation with a simple arrangement.

Industrial Applicability

Such capacitance detection apparatus can be used in a locking system configured to effect communication between a mobile device carried by a user and a main apparatus mounted on a vehicle to verify the mobile device and then effect automatic locking/unlocking of a door. Specifically, the inventive apparatus can be used in such locking system for a sensor configured to detect a user's human-induced operation through detection of presence/absence of an operation to a door handle.

Description of Reference Marks/Numerals

1: switch controlling unit
2: counting unit
3: output determining unit
4: change amount calculating unit
7: comparator (potential determining unit)
V1: first potential source
V2: second potential source
Cs: reference capacitance
Cx1: measured capacitance
N1, N2: number of repetition times of second switch operation
PH1: first switching control process
PH2: second switching control process
S1: first switch
S2: second switch
S3: third switch
T1: terminal of first switch (one terminal of first switch)
T2: terminal of first switch (the other terminal of first switch)
T3: terminal of second switch (the other terminal of second switch)
T4: terminal of second switch (one terminal of second switch)
T10: initialization period
T21: first charging period
T22: second charging period
T31: first discharging period
T32: second discharging period
Vref: set potential
$\Delta N1$, $\Delta N2$: change amounts

The invention claimed is:

1. A capacitance detection apparatus comprising:
   a first switch disposed between opposed terminals of a reference capacitance, one of the opposed terminals of the reference capacitance being connected to a first potential source;
   a second switch disposed between the other terminal of a measured capacitance and the other terminal of said reference capacitance, one terminal of terminal of said measured capacitance being connected to a second potential source or a free space;
   a third switch disposed between the opposed terminals of said measured capacitance;
   a first switch operation rendering said first switch to a closed state and then returning said first switch to an opened state upon lapse of an initialization period, a second switch operation rendering said second switch to a closed state and then returning said second switch to an opened state upon lapse of a first charging period, a third switch operation rendering said third switch to a closed state and then returning said third switch to an opened state upon lapse of a first discharging period;
   a first switching control process executing said second switch operation and said third switch operation alternately after executing said first switch operation;
   a second switching control process executing said first switch operation and then executing said second switch operation for a second charging period different from said first charging period and executing said third switch operation for a second discharging period, in alternation;
   a switch controlling unit for alternately executing the first switching control process and the second switching control process;
   a potential determining unit for determining whether the potential of the other terminal of said reference capacitance has changed to a predetermined set potential from an initial potential after said first switch operation, by said first switching control process and said second switching control process;
   a counting unit for counting the number of times of repetition of said second switch operation executed until the potential of the other terminal of the reference capacitance changes to said set potential, in said first switching control process and said second switching control process; and
   an output determining unit for determining presence/absence of change in capacitance of said measured capacitance, based upon the counted number of repetition times counted in at least one of said first switching control process and said second switching control process, said output determining unit determining also whether the change in the capacitance in the measured capacitance is due to an event of detection interest or not, based on the numbers of repetition times in said first switching control process and the number of repetition times in said second switching control process.

2. The capacitance detection apparatus according to claim 1, wherein said first discharging period is set as a period longer than said first charging period and said second discharging period is set as a period longer than said second charging period.

3. The capacitance detection apparatus according to claim 1, wherein there is further provided a change amount calculating unit for calculating change amounts which are differences between the numbers of repetition times of the second switch operation executed respectively in two consecutively executed first control processes and in two consecutively executed second controls; and
   said output determining unit determines the presence/absence of change in capacitance of said measured capacitance, based upon said change amount in at least one of said two consecutively executed first switching control processes and said two consecutively executed second switching control processes, said output determining unit determining also whether the change in the capacitance in the measured capacitance is due to an event of detection interest or not, based on said change amounts in the first switching control process and the change amount in the second switching control process.

4. The capacitance detection apparatus according to claim 3, wherein said output determining unit determines the presence/absence of change in the capacitance value of the measured capacitance based upon the change amount of the second switch operation which is executed with whichever shorter one of the first charging period or the second charging period.

5. The capacitance detection apparatus according to claim 3, wherein said output determining unit determines whether the change in the capacitance value of the measured capacitance is due to an event of detection interest or not, based on a ratio or a difference between the change amount in said first switching control process and the change amount in said second switching control process.

6. The capacitance detection apparatus according to claim 2, wherein there is further provided a change amount calculating unit for calculating change amounts which are differences between the numbers of repetition times of the second switch operation executed respectively in two consecutively executed first control processes and in two consecutively executed second controls; and said output determining unit determines the presence/absence of change in capacitance of said measured capacitance, based upon said change amount in at least one of said two consecutively executed first switching control processes and said two consecutively executed second switching control processes, said output determining unit determining also whether the change in the capacitance in the measured capacitance is due to an event of detection interest or not, based on said change amounts in the first switching control process and the change amount in the second switching control process.

7. The capacitance detection apparatus according to claim 4, wherein said output determining unit determines whether the change in the capacitance value of the measured capacitance is due to an event of detection interest or not, based on a ratio or a difference between the change amount in said first switching control process and the change amount in said second switching control process.

* * * * *